United States Patent
Park et al.

(10) Patent No.: US 7,198,773 B2
(45) Date of Patent: Apr. 3, 2007

(54) SYNTHESIS OF ZNO NANO-STRUCTURED MATERIALS AND ITS APPARATUS

(75) Inventors: Jae-Hwan Park, Seoul (KR); Heon-Jin Choi, Seoul (KR); Jae-Gwan Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 459 days.

(21) Appl. No.: 10/629,796

(22) Filed: Jul. 30, 2003

(65) Prior Publication Data

US 2007/0041892 A1    Feb. 22, 2007

(30) Foreign Application Priority Data

Jul. 21, 2003   (KR) ..................... 10-2003-0049836

(51) Int. Cl.
  *C01G 9/00* (2006.01)
(52) U.S. Cl. .............. 423/622; 423/623; 977/762; 977/755; 977/811
(58) Field of Classification Search ............... 423/622, 423/623; 977/762, 755, 811
  See application file for complete search history.

(56) References Cited

U.S. PATENT DOCUMENTS 6,710,091 B1 *   3/2004   Womelsdorf et al. ......... 516/33

2005/0214190 A1 *   9/2005   Hyeon et al. ............... 423/299
2005/0249660 A1 *   11/2005   Liao et al. .................. 423/622

OTHER PUBLICATIONS

Xia et al.; "One-Dimensional Nanostructures: Synthesis, Characterization, and Applications"; Advanced Materials, vol. 15, No. 5, pp. 353-389, (2003).

Tseng et al.; "Towards Nanocomputers"; Science, vol. 294: pp. 1293-1294, (2001).

Huang et al.; "Catalytic Growth of Zinc Oxide Nanowires"; Advanced Materials, vol. 13, No. 2, pp. 113-116, (2001).

* cited by examiner

*Primary Examiner*—Timothy C. Vanoy
(74) *Attorney, Agent, or Firm*—Finnegan Henderson Garrett & Dunner LLP

(57) ABSTRACT

Disclosed are a method of fabricating ZnO nanostructures and its apparatus, and more particularly, to a method of fabricating ZnO nanostructures from Zn gas, which is produced by a reduction process between ZnO powder and graphite, on a silicon substrate, wherein various types of nanostructures are reproducibly generated by adjusting the processing temperature and the mixed ratio between oxygen and argon gases, which are introduced into the interior of a reaction tube as carrier gases, and its apparatus.

11 Claims, 3 Drawing Sheets

SYNTHESIS OF ZNO NANO-STRUCTURED MATERIALS AND ITS APPARATUS

BACKGROUND OF INVENTION

1. Field of the Invention

The present invention relates to a method of fabricating ZnO nanostructures and its apparatus, and more particularly, to a method of fabricating ZnO nanostructures from Zn gas, which is produced by a reduction process between ZnO powder and graphite, on a silicon substrate, wherein various types of nanostructures are reproducibly generated by adjusting the processing temperature and the mixed ratio between oxygen and argon gases, which are introduced into the interior of a reaction tube as carrier gases, and its apparatus.

2. Description of the Background Art

Nanostructures are generally in the range of from a few nanometers to a few hundred nanometers and exhibit novel physical and chemical properties due to their nanoscaled dimensions unlike bulk type materials. These nanoscaled building blocks can be used in fabricating highly sophisticated and/or functional nanodevices in the fields of electronics, optoelectronics, and electrochemistry. To date, nanoscaled building blocks such as quantum dots, nanopowders, nanowires, nanotubes, quantum wells, nanofilms, and nano composites have been intensively investigated, especially for the bottom-up approaches to nanoelectronics (Y. Xia at al, *Advanced Materials*, Vol. 15, p. 353 (2003); G. Tseng, *Science*, Vol. 294, p. 1293 (2001)).

In the meantime, ZnO has been in the spotlight as a promising material for electronic devices, surface acoustic wave devices, optoelectronic devices, piezoelectric devices, and chemical sensors, transparent electrodes due to its wide bandgap, optical transparency, and tunable conductivity.

Furthermore, advances in epitaxial growth technology have promoted the developments of various optoelectronic devices including blue/green light emitting diode and laser diode.

A typical example of ZnO nanostructure fabrication is synthesis of nanowires (Y. Xia at al, *Advanced Materials*, Vol. 15, p. 353 (2003); M. H. Huang et al., *Advanced Materials*, Vol. 13, p. 113 (2001)).

Various types of 1-dimensional ZnO nanostructures (nanowires, nanotubes, etc.) have been fabricated using such processes as carbothermal reduction and chemical vapor deposition, and they were also shown to be applicable into optoelectronic devices, laser diodes, chemical sensors and the like.

Although there are a number of reports on the ZnO nanostructures, the feasibility of realizing highly integrated functional devices is still questionable due to the difficulties in alignment and assembly of the nanostructures. In this regards, creation of nanoscaled building blocks of various size and shapes is crucial. In this invention, we invented various ZnO nanostructures, especially ultrawide ZnO nanosheets and nanowire arrays which can be easily manipulated by conventional lithography and/or assembly techniques, while maintaining nano-sized features.

SUMMARY OF THE INVENTION

Therefore, the object of the present invention is to provide a reproducible and cost-effective method for fabricating nanostructures of various shapes and large size, and its apparatus.

BRIEF DESCRIPTION OF THE DRAWINGS

The aforementioned aspects and other features of the present invention will be explained in the following description, taken in conjunction with the accompanying drawings, wherein.

CODE EXPLANATION

Figure 1:
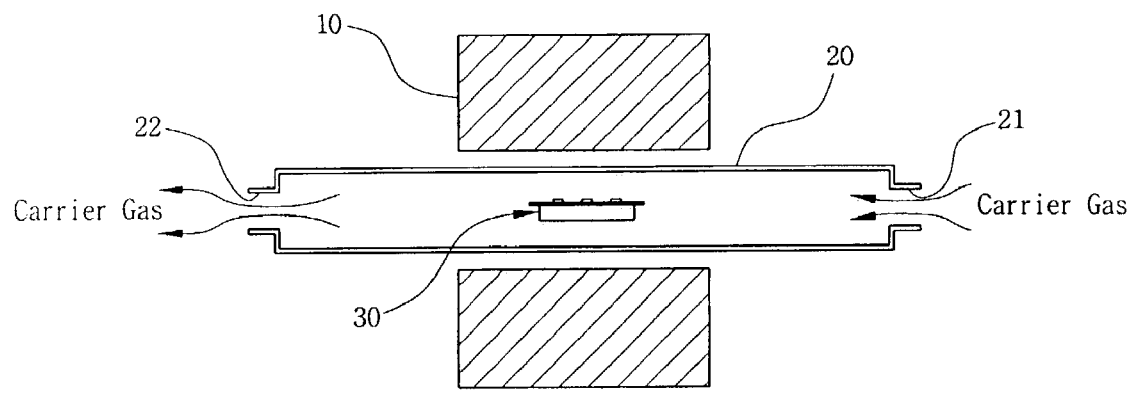
FIG. 1 shows a schematic cross-sectional view of a nanostructure apparatus.

10: Heating Element
20: Reaction Tube
21: Carrier Gas Inlet
22: Carrier Gas Outlet
30: Reactant
31: Boat
32: Source material
33: Substrate

DETAILED DESCRIPTION OF THE INVENTION

The present invention relates to a method for fabricating ZnO nanostructures of various types from Zn gas, which is produced by a reduction process between ZnO powder and graphite, on a silicon substrate, wherein the reduction process is performed at 800–950° C. in the presence of a gas mixture where oxygen content is 1–20 vol % with reference to that of argon gas.

The present invention also relates to an apparatus for fabricating ZnO nanostructures comprising:

a heating element 10 which maintains the internal temperature of a reaction tube at 800–950° C. for heating a substrate and source materials within the reaction tube;

a reaction tube 20 for distribution of source material and a substrate which horizontally passes through the interior of the heating element 10 while being positioned inside the heating element 10, wherein a gas inlet 21 and a gas outlet 22 for the introduction and release of a carrier gas, respectively, are located at each end of the reaction tube; and a reactant 30 which, being positioned inside the reaction tube 20, receives the source materials and the substrate.

The present invention is explained in more detail as set forth hereunder.

The preparation of source materials and a catalyzed substrate are as follows. A 1:1 mixture of ZnO and graphite by weight is dry-milled for 1–3 hours. The ZnO powder and graphite used in the present invention should have high purity (>99%) and a particle of greater than 100 mesh in size, preferably 100–325 mesh. These two source materials are inexpensive and are readily available in commercial market.

Graphite is added to facilitate the fabrication at a temperature lower than 1000° C. Graphite reacts with ZnO at low-temperature range (800~950° C.) to form Zn gas, which is then used in fabricating ZnO nanostructures. The substrate, on which nanostructures are fabricated, is silicon (100) substrate and it is coated with gold (Au) to be 10~30 angstrom (Å) thick. According to a recent publication (M. H. Huang et al., *Advanced Materials*, Vol. 13, p. 113 (2001)), coated Au reacts with Zn gas which results from the carbothermal reduction of ZnO with graphite, thereby producing an Au—Zn alloy and finally ZnO nanowire.

The well-known technology disclosed in the aforementioned Huang et al. teaches to use only argon (Ar) gas as a carrier gas and thus it cannot fabricate other types of nanostructures but only ZnO nanowires. However, the oxygen gas, where the oxygen gas is used 1–20 vol % with reference to that of an argon gas, thus rendering a great advantage over the conventional technology.

FIG. 1 shows a schematic cross-sectional view of a nanostructure apparatus, which comprises a heating element 10 for controlling the internal temperature of a heating reaction tube 20, a heating reaction tube 20 for entry and release of carrier gases, and a reactant 30 which receives source materials and a substrate. The heating element 10 controls the internal temperature of the heating reaction tube 20 to be maintained at a temperature of 800~950° C. The heating reaction tube 20, while being positioned inside the heating element 1, horizontally passes through the interior of the heating element 10, wherein a gas inlet 21 and a gas outlet 22 for the entry and release of a carrier gas, respectively, are located at each end of the reaction tube 20; and a reactant 30 which, being positioned inside the reaction tube 20, receives the source materials and the substrate. The reaction tube 20 is made of transparent quartz tube.

Figure 2:
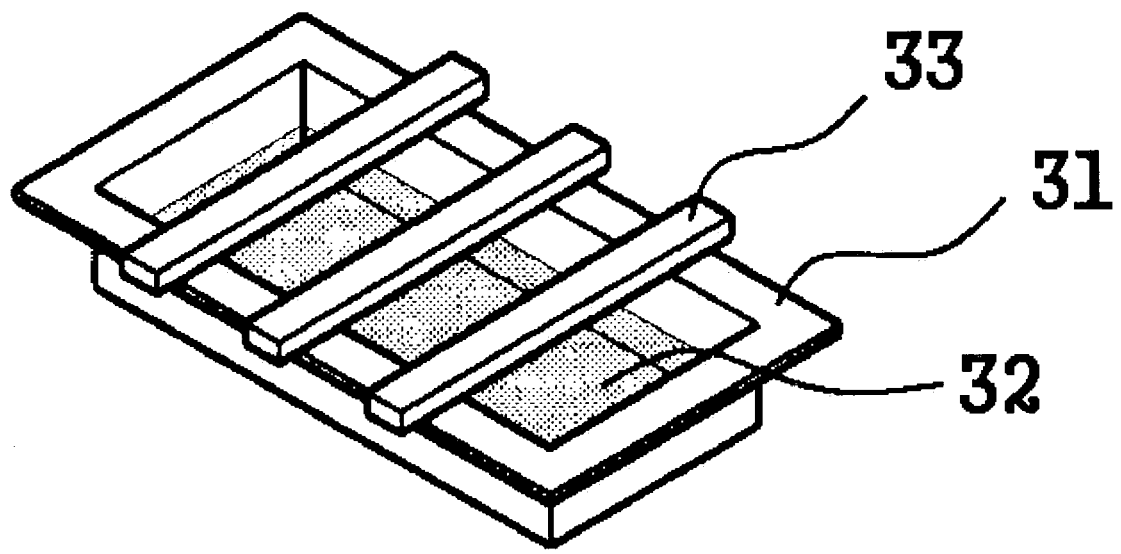
FIG. 2 shows an enlarged perspective view the source materials and substrates.

The reactant 30 is provided with source materials and a substrate. As shown in FIG. 2, the reactant 30, while its upper portion is laid open, comprises a boat 31 of a rectangular shape where a certain amount of source materials and a substrate are to be contained; source materials and a substrate 32 which are to be contained in the boat 31; and a plurality of substrates 33 which are spanned at regular intervals over the boat 31 in the direction of the width of the boat 31. The boat 31 is made of alumina ($Al_2O_3$) and has a size of 13 mm×13 mm×60 mm. The source materials is a mixed composition where ZnO powder and graphite are mixed in 1:1 ratio by weight and is filled in to be 30–70% of the total capacity of the boat 31. The substrate 33 is a silicon plate coated with gold (Au) and placed on the top of the boat 31 after they are cut into a size of 8 mm×2 mm. In this array, it is very important that the location of a substrate be separated from the source materials to the extent of 3–10 mm in a vertical direction so that an appropriate level of Zn vapor pressure can be maintained and this, along with supplied oxygen gas, then enables to finally obtain nanostructures. The substrate and source materials are positioned at the same location because the temperature of the substrate is desired to be the same as that of the source materials. In particular, they are placed about 0–50 mm apart from the center of the reaction tube toward the outlet of the carrier gas.

The method of fabricating nanostructures using a nanostructure apparatus is described further herein under.

Prior to heat treatment, the reaction tube provided with the substrate and source materials as shown in FIG. 2 was purged with Ar and $O_2$ gases for an hour. By this process, residual air in the tube was evacuated.

The appropriate amount of Ar flow for the evolution of ZnO nanostructures was in the range of 20~50 cc/min and $O_2$ flow was mixed with Ar gas to be 1–20% percent with reference to that of Ar gas. The variation within the range of 20~50 cc/min did not reveal any noticeable changes in the resulting nanostructures. Hereinafter, all the experimental details are described based on the condition of Ar 30 cc. After heat-treatment, various nanostructures such as combs, rods, rod arrays, ultrawide sheets in addition to the typical nanowires were fabricated.

In one embodiment of the present invention, nanostructures were fabricated by fixing the amount of Ar flow at 30 cc/min while allowing variations in the reaction temperature and the mixing ratio of oxygen gas. The result showed that the conventional types of ZnO nanowires were well fabricated but also various structures such as ZnO nanowire arrays, nanosheets, nanorods, and nanoplates were formed as well according to the control of reaction temperature and the mixing ratio of oxygen gas.

Figure 3:
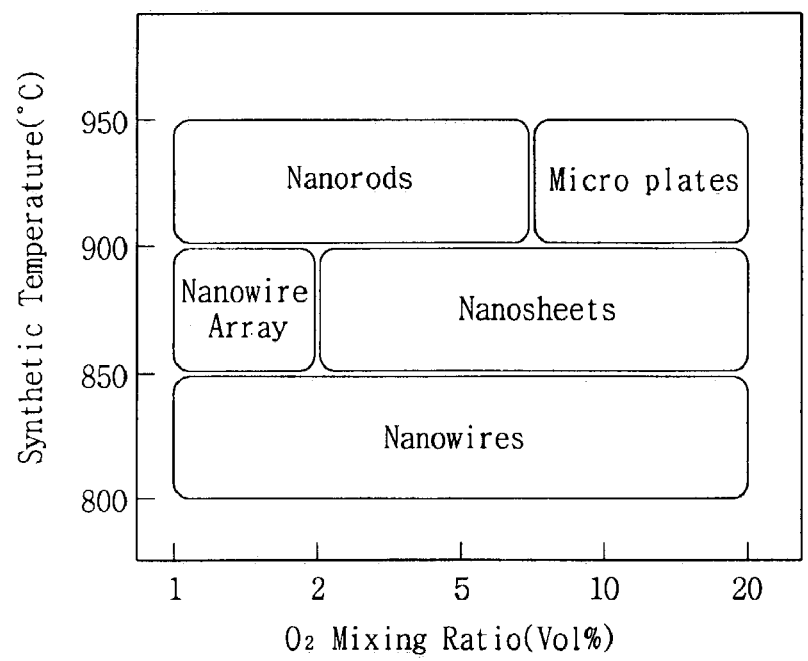
FIG. 3 shows the summary of various types of nanostructures produced in the area where the internal temperature of a reaction tube and the mixing ratio of carrier gases are under control.
Figure 4:
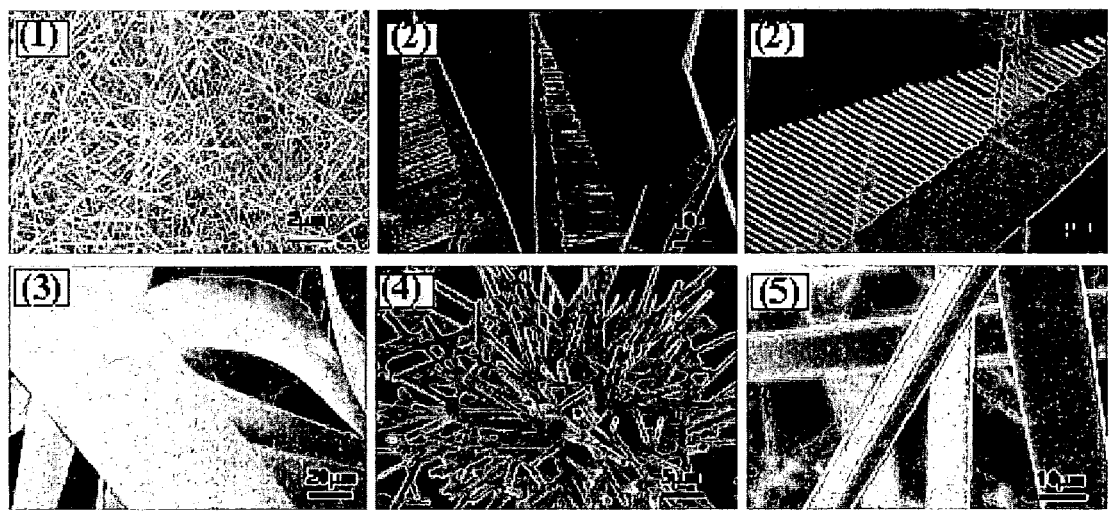
FIG. 4 shows the electron microscopic view of various types of nanostructures produced in the area where the internal temperature of a reaction tube and the mixing ratio of carrier gases are under control (1: nanowires, 2: nanowire arrays, 3: nanosheets, 4: nanorods, 5: nanoplates)

FIG. 3 shows representative nanostructures formed according to the variation of the reaction temperature and the mixing ratio of oxygen gas and FIG. 4 shows an electron microscopic view of each of the images of nanostructures thus formed. FIG. 3 shows most frequently observed structures and these representative structures continue to appear in the neighboring experimental conditions where the fabrication temperature and the mixing ratio of oxygen gas are slightly varied.

In an embodiment, where the Ar flow is 30 cc/min, reaction temperature is 800–850° C., and the oxygen content with reference to the Ar gas is 1–20 vol %, nanowire structures were fabricated and the electron microscopic view of the fabricated nanowires are shown in FIG. 4 (1). The nanowires were 50–200 nm in diameter and 5–100 μm in length.

In another embodiment, where the Ar flow is 30 cc/min, reaction temperature is 850–900° C., and the oxygen content with reference to the Ar gas is 1–2 vol %, nanowire arrays were fabricated and the electron microscopic view of the fabricated nanowire arrays are shown in FIG. 4 (2). The nanowire arrays were of a comb shape and were 10–50 μm in width, 50–1000 μm in length and 50–300 nm in diameter. These nanostructures were reproducibly fabricated in the above experimental condition. These nanostructures can be applied to arrayed nanolaser array and the like and also can be used as a chemical or physical sensor arrays.

In still another embodiment, where the Ar flow is 30 cc/min, reaction temperature is 850–900° C., and the oxygen content with reference to the Ar gas is 2–20 vol %, nanosheets were fabricated and the electron microscopic view of the fabricated nanosheets are shown in FIG. 4 (3). The nanosheets were 10–100 μm in width, 500–2000 μm in length and 50–150 nm in diameter. These nanostructures were reproducibly fabricated in the above experimental condition. These nanostructures can be applied to highly functional and high density chemical sensors, electrodes, catalysts and the like.

In still another embodiment, where the Ar flow is 30 cc/min, reaction temperature is 900–950° C., and the oxygen content with reference to the Ar gas is 1–8 vol %, nanorods were fabricated and the electron microscopic view of the fabricated nanorods are shown in FIG. 4 (4). The nanorods were 5–50 μm in length and 200–500 nm in diameter. These nanorods were reproducibly fabricated in the above experimental condition. These nanostructures can be applied to laser arrays and the like.

In still another embodiment, where the Ar flow is 30 cc/min, reaction temperature is 900–950° C., and the oxygen content with reference to the Ar gas is 8–20 vol %, nanoplates were fabricated and the electron microscopic view of the fabricated nanoplates are shown in FIG. 4 (5). The nanoplates were 5–50 μm in width, 20–1000 μm in length and 500–2000 nm in diameter. These nanoplates were reproducibly fabricated in the above experimental condition. These nanostructures can be applied to chemical catalysts and the like.

Figure 5:
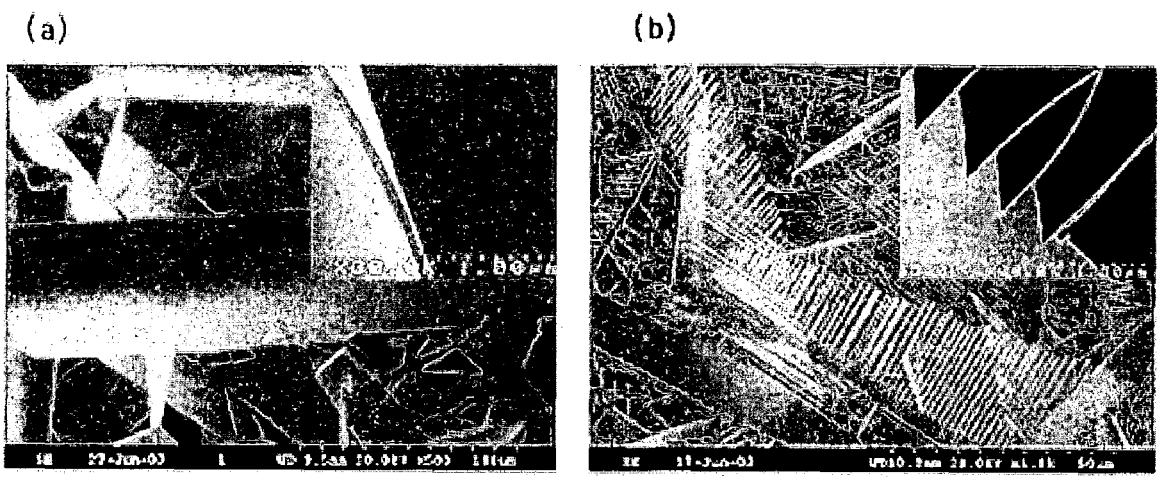
FIG. 5 shows the electron microscopic view of the nanosheets and nanowire arrays typically observed according to the variation in the mixing ratio of carrier gases (a: nanosheets, b: nanowire arrays).

In still another embodiment, where the Ar flow is 30 cc/min, reaction is performed for 30 min at 900° C., and the oxygen content with reference to the Ar gas is 10 and 2 vol %, respectively, nanosheets and nanowire arrays were fabricated, respectively, and their electron microscopic views of the fabricated nanosheets and nanowire arrays are shown in FIGS. 5 (a) and 5 (b), respectively.

When the oxygen content was 10 vol %, nanosheets were fabricated and they were 70 μm in width, 500 μm in length and 100 nm in diameter. When the oxygen content was 2 vol %, nanowire arrays were fabricated and they were 30–50 μm in width, 100–200 μm in length and 100 nm in diameter. The electron microscopic view of the fabricated nanosheets are shown in FIG. 5 (a) and the electron microscopic view of the fabricated nanowire arrays are shown in FIG. 5 (b).

Among the aforementioned various nanostructures, nanosheets and nanowire arrays are of utmost importance in technological aspects. For example, the nanosheets have high specific surface area and chemical stability, and thus they are useful in applications to energy generation, storage, and the like. Further, the comb-like structures of nanowire arrays may be used as aligned nanoscale building blocks such as arrayed laser assembly and arrayed chemical sensor block.

As described above, the nanostructures obtained in the present invention, unlike the known nanostructures, are peculiar in that they have an ultrawide structure of having few tens to few hundred nanometers in thickness while their width and length are of few tens of micrometers, respectively. Therefore, these nanostructures are advantageous in that they can facilitate the fabrication of nanoelectronic devices using an optical microscope or a simple process without going through a rather complex process such as e-beam lithography.

What is claimed is:

1. A method for fabricating ZnO nanostructures, comprising:
   preparing a mixture of ZnO powder and graphite;
   exposing said mixture of ZnO powder and graphite to a gas mixture comprising oxygen gas and argon gas, where the oxygen gas is present at a concentration of 1–20 vol % relative to the argon gas volume;
   providing a silicon substrate on which to grow ZnO nanostructures; and
   heating said mixture of ZnO powder and graphite to a temperature of 800–950° C. in the presence of said gas mixture.

2. The method for fabricating ZnO nanostructures according to claim 1, wherein said argon gas is introduced into a reaction tube at the rate of 20–50 cc/min.

3. The method for fabricating ZnO nanostructures according to claim 1, wherein said silicon substrate is coated with gold to provide a gold layer that is 10–30 angstrom (Å) thick.

4. The method for fabricating ZnO nanostructures according to claim 1, wherein nanowires are fabricated in the condition where a reaction temperature is 800–850° C., and argon gas is introduced into a reaction tube at the rate of 20–50 cc/min.

5. The method for fabricating ZnO nanostructures according to claim 4, wherein said nanowires are 50–200 nm in diameter and 5–100 μm in length.

6. The method for fabricating ZnO nanostructures according to claim 1, wherein nanowire arrays are fabricated in the condition where a reaction temperature is 850–900° C., argon gas is introduced into a reaction tube at the rate of 20–50 cc/nm, the oxygen gas is present at a concentration of 1–2 vol % relative to the argon gas volume.

7. The method for fabricating ZnO nanostructures according to claim 6, wherein said nanowire arrays are of a comb shape and 10–50 μm in width, 50–1000 μm in length and 50–300 nm in diameter.

8. The method for fabricating ZnO nanostructures according to claim 1, wherein nanosheets are fabricated in the condition where a reaction temperature is 850–900° C., argon gas is introduced into a reaction tube at the rate of 20–50 cc/min, and the oxygen gas is present at a concentration of 2–20 vol % relative to the argon gas volume.

9. The method for fabricating ZnO nanostructures according to claim 8, wherein said nanosheets are 10–100 μm in width, 500–2000 μm in length and 50–150 nm in diameter.

10. The method for fabricating ZnO nanostructures according to claim 1, wherein nanorods are fabricated in the condition where a reaction temperature is 900–950° C., argon gas is introduced into a reaction tube at the rate of 20–50 cc/min, and the oxygen gas is present at a concentration of 1–8 vol % relative to the argon gas volume.

11. The method for fabricating ZnO nanostructures according to claim 1, wherein nanoplates are fabricated in the condition where a reaction temperature is 900–950° C., argon gas is introduced into a reaction tube at the rate of 20–50 cc/min, and the oxygen gas is present at a concentration of 8–20 vol % relative to the argon gas volume.

* * * * *